United States Patent
Seendripu et al.

(10) Patent No.: US 8,374,568 B2
(45) Date of Patent: Feb. 12, 2013

(54) HARMONIC REJECT RECEIVER ARCHITECTURE AND MIXER

(75) Inventors: Kishore Seendripu, Carlsbad, CA (US); Raymond Montemayor, Encinitas, CA (US); Sheng Ye, Carlsbad, CA (US); Glenn Chang, Carlsbad, CA (US); Curtis Ling, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 13/568,286

(22) Filed: Aug. 7, 2012

(65) Prior Publication Data

US 2012/0302192 A1 Nov. 29, 2012

Related U.S. Application Data

(60) Continuation of application No. 12/432,666, filed on Apr. 29, 2009, which is a division of application No. 11/302,531, filed on Dec. 12, 2005, now abandoned.

(60) Provisional application No. 60/635,030, filed on Dec. 10, 2004.

(51) Int. Cl.
*H04B 1/10* (2006.01)
*H04B 15/06* (2006.01)

(52) U.S. Cl. ......... 455/317; 455/318; 455/304; 455/258

(58) Field of Classification Search .......... 455/296–312, 455/313–333, 255–265
See application file for complete search history.

(56) References Cited

U.S. PATENT DOCUMENTS

| | | | | |
|---|---|---|---|---|
| 5,179,730 A | * | 1/1993 | Loper | 455/266 |
| 5,483,695 A | * | 1/1996 | Pardoen | 455/314 |
| 6,226,509 B1 | * | 5/2001 | Mole et al. | 455/302 |
| 6,282,413 B1 | * | 8/2001 | Baltus | 455/260 |
| 6,334,051 B1 | * | 12/2001 | Tsurumi et al. | 455/324 |
| 7,035,615 B2 | * | 4/2006 | Kim et al. | 455/317 |
| 7,076,231 B2 | * | 7/2006 | Yamawaki et al. | 455/323 |
| 7,130,604 B1 | * | 10/2006 | Wong et al. | 455/302 |
| 7,327,198 B2 | * | 2/2008 | Pan | 331/38 |
| 7,358,885 B2 | | 4/2008 | Maxim et al. | |
| 7,421,259 B2 | * | 9/2008 | Gomez et al. | 455/130 |
| 7,519,348 B2 | * | 4/2009 | Shah | 455/285 |
| 7,599,676 B2 | | 10/2009 | Maxim | |
| 7,643,600 B2 | | 1/2010 | Maxim et al. | |
| 7,773,968 B2 | | 8/2010 | Maxim et al. | |
| 8,121,241 B2 | * | 2/2012 | Stengel et al. | 375/371 |
| 8,138,817 B2 | * | 3/2012 | Brekelmans et al. | 327/355 |

(Continued)

FOREIGN PATENT DOCUMENTS

WO WO 2004/006433 A1 1/2004

OTHER PUBLICATIONS

Aslam A. Rafi, Alessandro Piovaccari, Peter Vancorenland and Tyson Tuttle, "3.8 A Harmonic Rejection Mixer Robust to RF Device Mismatches," 2011 IEEE International Solid-State Circuits Conference, Session 3, p. 66.

(Continued)

*Primary Examiner* — Edward Urban
*Assistant Examiner* — Rui Hu
(74) *Attorney, Agent, or Firm* — McAndrews, Held & Malloy, Ltd.

(57) ABSTRACT

Receiver architectures and methods of processing harmonic rich input signals employing harmonic suppression mixers are disclosed herein. The disclosed receivers, mixers, and methods enable a receiver to achieve the advantages of switching mixers while greatly reducing the mixer response to the undesired harmonics. A harmonic mixer can include a plurality of mixers coupled to an input signal. A plurality of phases of a local oscillator signal can be generated from a single local oscillator output. Each of the phases can be used to drive an input of one of the mixers. The mixer outputs can be combined to generate a frequency converted output that has harmonic rejection.

22 Claims, 6 Drawing Sheets

U.S. PATENT DOCUMENTS

| | | | |
|---|---|---|---|
| 8,155,615 B2* | 4/2012 | Ruelke et al. .................. | 455/295 |
| 2001/0014594 A1* | 8/2001 | Khlat et al. .................... | 455/303 |
| 2003/0129955 A1* | 7/2003 | Gilmore ......................... | 455/303 |
| 2003/0176177 A1* | 9/2003 | Molnar et al. ................. | 455/323 |
| 2003/0186669 A1* | 10/2003 | Yamawaki et al. ............ | 455/323 |
| 2004/0038649 A1* | 2/2004 | Lin et al. ........................ | 455/130 |
| 2004/0137869 A1* | 7/2004 | Kim ................................ | 455/324 |
| 2004/0214547 A1* | 10/2004 | Kim et al. ...................... | 455/296 |
| 2005/0059376 A1* | 3/2005 | Davis ............................. | 455/323 |
| 2005/0232382 A1* | 10/2005 | Stikvoort et al. .............. | 375/347 |
| 2005/0233723 A1* | 10/2005 | Gomez et al. ................. | 455/323 |
| 2005/0239430 A1* | 10/2005 | Shah .............................. | 455/326 |
| 2005/0272394 A1* | 12/2005 | Heck .............................. | 455/314 |
| 2006/0040634 A1* | 2/2006 | Wang ............................. | 455/313 |
| 2007/0117530 A1* | 5/2007 | Davis ............................. | 455/316 |
| 2008/0130800 A1 | 6/2008 | Maxim et al. | |
| 2008/0132189 A1 | 6/2008 | Maxim et al. | |
| 2008/0180579 A1 | 7/2008 | Maxim | |
| 2008/0181337 A1 | 7/2008 | Maxim | |
| 2008/0181340 A1 | 7/2008 | Maxim | |
| 2010/0112973 A1* | 5/2010 | Ruelke et al. .................. | 455/326 |

OTHER PUBLICATIONS

Canadian Intellectual Property Office, Official action in Application No. 2,590,456, dated Jul. 31, 2012. (2 pages).

J.A. Weldon et al., "A 1.75 GHZ Highly Integrated Narrow-Band CMOS Transmitter With Harmonic-Rejection Mixers", IEEE Journal of Solid-State circuits, IEEE Service Center, Piscataway, NJ, US, vo. 36, No. 12, Dec. 2001, pp. 2003-2015, XP 001222523, ISSN: 0018-9200. (13 pages).

PCT, Notification of Transmittal of the International Search Report and the Written Opinion of the International Searching Authority, or the Declaration, in International application No. PCT/US2005/045099, dated Mar. 4, 2006. (4 pages).

PCT, International Preliminary Report on Patentability with the Written Opinion of the International Search Searching Authority, in International application No. PCT/US2005/045099, dated Jun. 13, 2007. (4 pages).

* cited by examiner

HARMONIC REJECT RECEIVER ARCHITECTURE AND MIXER

CROSS-REFERENCES TO RELATED APPLICATIONS

This application is a continuation of U.S. application Ser. No. 12/432,666, filed Apr. 29, 2009, which is a divisional of U.S. application Ser. No. 11/302,531, filed Dec. 12, 2005, which claims the benefit of U.S. Provisional Application No. 60/635,030, filed Dec. 10, 2004. The above-referenced United States patent applications are all hereby incorporated herein by reference in their entirety.

BACKGROUND

The disclosure relates to electronic signal processing. More particularly, the disclosure relates to a harmonic reject RF receiver, harmonic reject receiver architecture, and harmonic reject mixers.

RF communication systems often provide numerous frequency division multiplexed channels distributed over a predetermined operating band. A receiver can typically be configured to tune to a desired channel to receive the information provided on that channel.

In many communication systems, the operating band is a relatively narrow band. That is, the operating band typically does not occupy greater than an octave. However, in some communication systems, such as television, the operating frequency band may include hundreds of channels occupying several octaves.

Such a wide operating bandwidth can present particular problems not experienced in other systems having sub-octave operating frequency bands. For example, a wide operating bandwidth may include multiple in band interferers. The undesired channels in a television operating band can appear as interferers to the desired channel. The undesired channels can be at substantially the same power level, or even at a greater power level, than the power level of the desired channel.

A receiver typically filters or otherwise attenuates undesired channels and other interference sources. However, some interferers may contribute to in band interference due to operation of the receiver, such that filtering is ineffective. In particular, a receiver may unintentionally frequency convert the harmonics of the desired input signal to the same frequency band that is converts the desired signal.

Because the interferer can frequency convert to an in band interference signal, it is not possible to filter out the interference. Additionally, the input operating frequency band may span multiple octaves and may include the harmonics. The receiver may not be able to sufficiently eliminate the effects of the harmonic interferers by filtering the input signal.

BRIEF SUMMARY

Receiver architectures and methods of processing harmonic rich input signals employing harmonic suppression mixers are disclosed herein. The disclosed receivers, mixers, and methods enable a receiver to achieve the advantages of switching mixers while greatly reducing the mixer response to the undesired harmonics. A harmonic mixer can include a plurality of mixers coupled to an input signal. A plurality of phases of a local oscillator signal can be generated from a single local oscillator output. Each of the phases can be used to drive an input of one of the mixers. The mixer outputs can be combined to generate a frequency converted output that has harmonic rejection.

Aspects of the invention include a harmonic reject mixer that includes a plurality of mixers, each mixer having an input coupled to a common RF input, a phase shifter having an input coupled to a common LO input and a plurality of phase shifted outputs, each of the outputs coupled to a LO input on a corresponding mixer, and a combiner having a plurality of inputs, each input coupled to an output from an associated mixer, and configured to provide a combined output.

Aspects of the invention include a method of harmonic rejection mixing. The method includes generating a plurality of phases of a LO signal, mixing an input signal with each of the plurality of phases of the LO signal to generate a plurality of mixed output signals, and combining the plurality of mixed output signals to provide a mixer output.

Aspects of the invention include a quadrature mixer that includes a plurality of harmonic reject mixers, each mixer having an input coupled to one of a plurality of phases of an input signal, and each mixer having an input coupled to a phase shifted LO, a first combiner having inputs coupled to outputs from a first subset of the plurality of harmonic reject mixers, and an output configured to provide a quadrature output, and a second combiner having inputs coupled to outputs from a second subset of the plurality of harmonic reject mixers, and an output configured to provide an in-phase output.

Aspects of the invention include a receiver that includes a filter having an input coupled to an RF input, and a filtered output, and a harmonic reject down converter having an input coupled to the filtered output, a Local Oscillator (LO) input configured to receive an LO signal, a quadrature output, and an in-phase output.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF EMBODIMENTS OF THE INVENTION

This disclosure describes harmonic reject mixers and receiver architectures which utilize harmonic reject mixers to permit an efficient implementation of a direct downconversion or low-IF receiver. The current approach to receiver design may employ switching mixers within the receiver front end. This permits the system to achieve low noise and high linearity. However, these switching mixers also efficiently downconvert input signals at undesired harmonic multiples of the local oscillator frequency to the desired output frequency band. The frequency conversion of undesired signals poses a problem which is particularly important for television applications where the desired input range is so wide that the likelihood of undesired harmonics is high. Receiver architectures and methods of processing harmonic rich input signals employing harmonic suppression mixers are disclosed herein. The disclosed receivers, mixers, and methods enable a receiver to achieve the advantages of switching mixers while greatly reducing the mixer response to the undesired harmonics.

Figure 1:
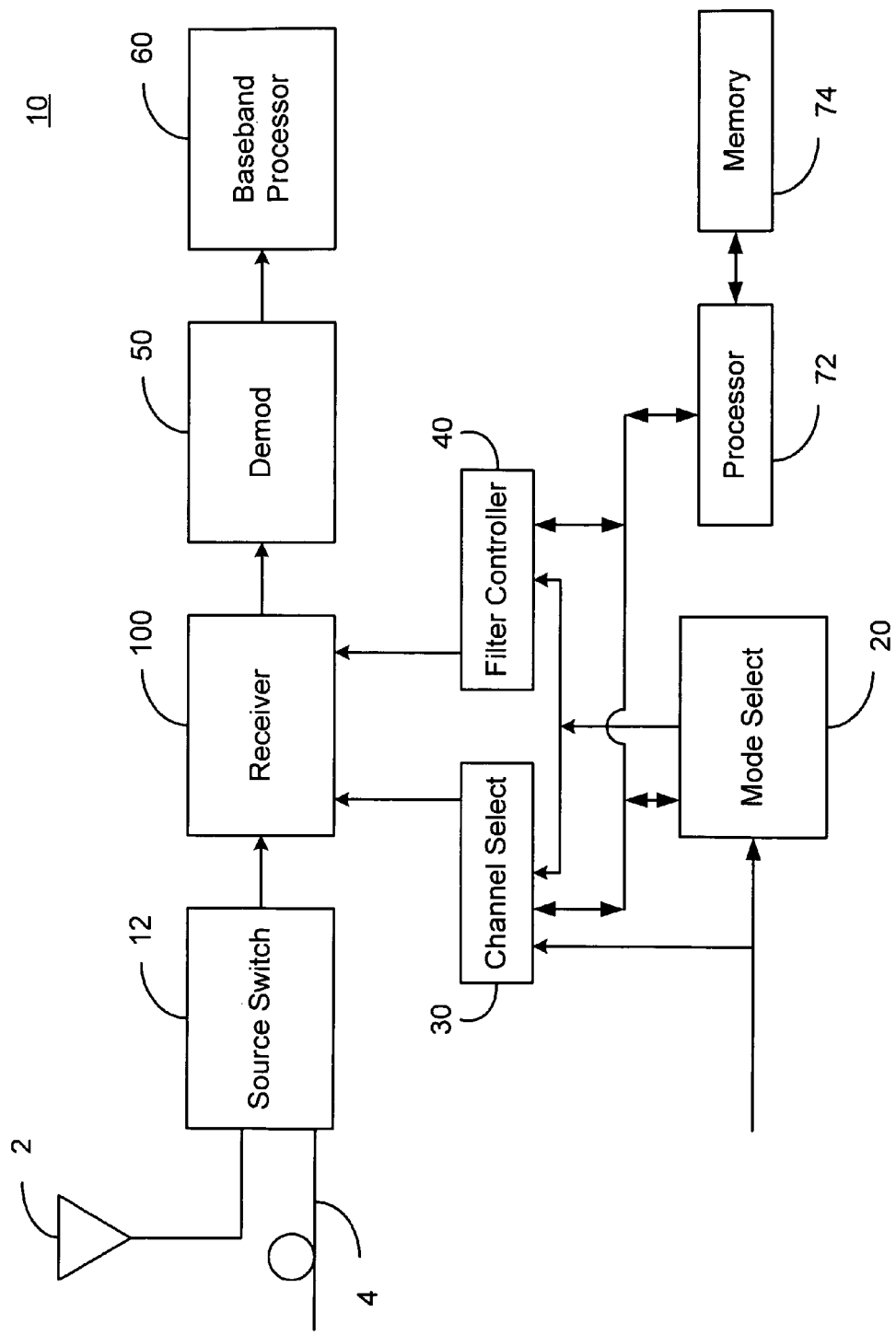
FIG. 1 is a simplified functional block diagram of an embodiment of a receiver in a system.

FIG. 1 is a simplified functional block diagram of an embodiment of a receiver 100 implementing harmonic reject signal processing in a system 10. The following description describes an embodiment in which the system 10 is configured to operate as a television receiver. However, the system 10 can be any of a plurality of systems. For example, the system 10 can be a television, television receiver, set top box, or television tuner integrated within a video recorder or some other television receiver. In other embodiments, the system 10 can be a radio receiver, wireless transceiver, telephone receiver, cellular telephone, cordless telephone, or some other communication device.

The system 10 can include a source switch 12 that can be coupled to one or more signal sources. For example, a first source input can be coupled to an antenna 2 and a second source input can be coupled to a wired source, such as a cable coupled to a cable television distributor. The source switch 12 is not limited to coupling only one type of signal to the receiver 100. For example, the source switch 12 can be coupled to a television signal source, for example, via the antenna 2, and can be coupled to a radio source, for example, via the cable 4.

The source switch 12 can be configured to couple any one of the signals from any signal source to the input of the receiver 100. The receiver 100 can be, for example, configured to selectively process television signals received from a signal source, such as analog television signals formatted according to an analog television standard, such as NTSC, PAL, SECAM, or some other analog television standard. The receiver 100 can also be configured to process digital television signals, such as digital DVB-T television signals, received from one of the signal sources.

The receiver 100 can receive the RF signal from the source switch 12 and can downconvert the signal to an output IF. The output IF from the receiver 100 can be coupled to a demodulator 50 and from the demodulator 50 to a baseband processor 60. In one embodiment, the demodulator 50 can be configured to demodulate a television signal at a predetermined IF. The demodulated television signals are communicated to a baseband processor 60 that can be configured, for example, to format the signals into video and audio signals for corresponding video and audio output devices (not shown).

The system 10 can also include a mode selection module 20 that can be configured to receive a mode selection input from an external source (not shown) that can be, for example, a user selection or user control. The mode can correspond to an operating mode of the receiver 100, and can be used to determine a particular operating band, channel spacing, channel bandwidths, and output IF frequency.

The mode select module 20 can be coupled to a channel select module 30. The channel select module 30 can be coupled to the mode select module 20 and can be configured to generate the desired local oscillator (LO) control signals. The channel select module 30 can generate the control signals needed to tune the LO frequencies of the receiver 100 to enable reception of the desired RF signal and generation of the desired output IF. The channel select module 30 can also receive one or more input signals from an external source (not shown), such as a user interface or some other module or device that can indicate a desired channel selection.

The channel select module 30 can independently control the RF and IF LOs within the receiver 100. For example, the channel select module 30 can tune the RF LO to a frequency that is based on both a mode and a desired channel. The channel select module 30 can also be configured to control the frequency of the IF LO and may be configured to control the IF LO based only on the desired mode. In other embodiments, the channel select module 30 can be configured to tune both the RF and LO frequencies for each channel.

The channel select module 30 can also be configured to control calibration of the receiver 100. The calibration can include DC offset calibration and In-phase (I) and Quadrature (Q) signal balancing. For example, the channel select module 30 can control an RF switch within the receiver 100 and can initiate the DC offset calibration. In another embodiment, a calibration module within the receiver 100 can receive the channel select signals and the filter control signals and can initiate DC offset calibration, including controlling the RF switch and filter bandwidths during the duration of the DC offset calibration.

A filter controller 40 can also be coupled to the mode select module 20. The filter controller 40 can be configured to provide the control signals to the receiver 100 that control one or more filter bandwidths within the receiver 100. The filter controller 40 can be configured to set the filter bandwidths based on the channel selectivity required in the receiver 100, which can depend on the operating mode.

The filter controller 40 can also be in communication with the channel select module 30. The filter controller 40 can be configured to control the filters within the receiver 100 to predetermined bandwidths for a predetermined calibration duration following each channel change. For example, the filter controller 40 can be configured to tune the filters to a minimal bandwidth during DC offset calibration. Alternatively, a calibration module within the receiver 100 can be configured to control the filter bandwidths during the calibration duration.

A processor 72 and associated memory 74 can be included within the system 10 and can be configured to perform one or more functions within each of the modules. For example, the memory 74 can include one or more processor 72 usable instructions in the form of software that can, when executed by the processor 72, perform some or all of the functions of the various modules within the system 10.

Figure 2:
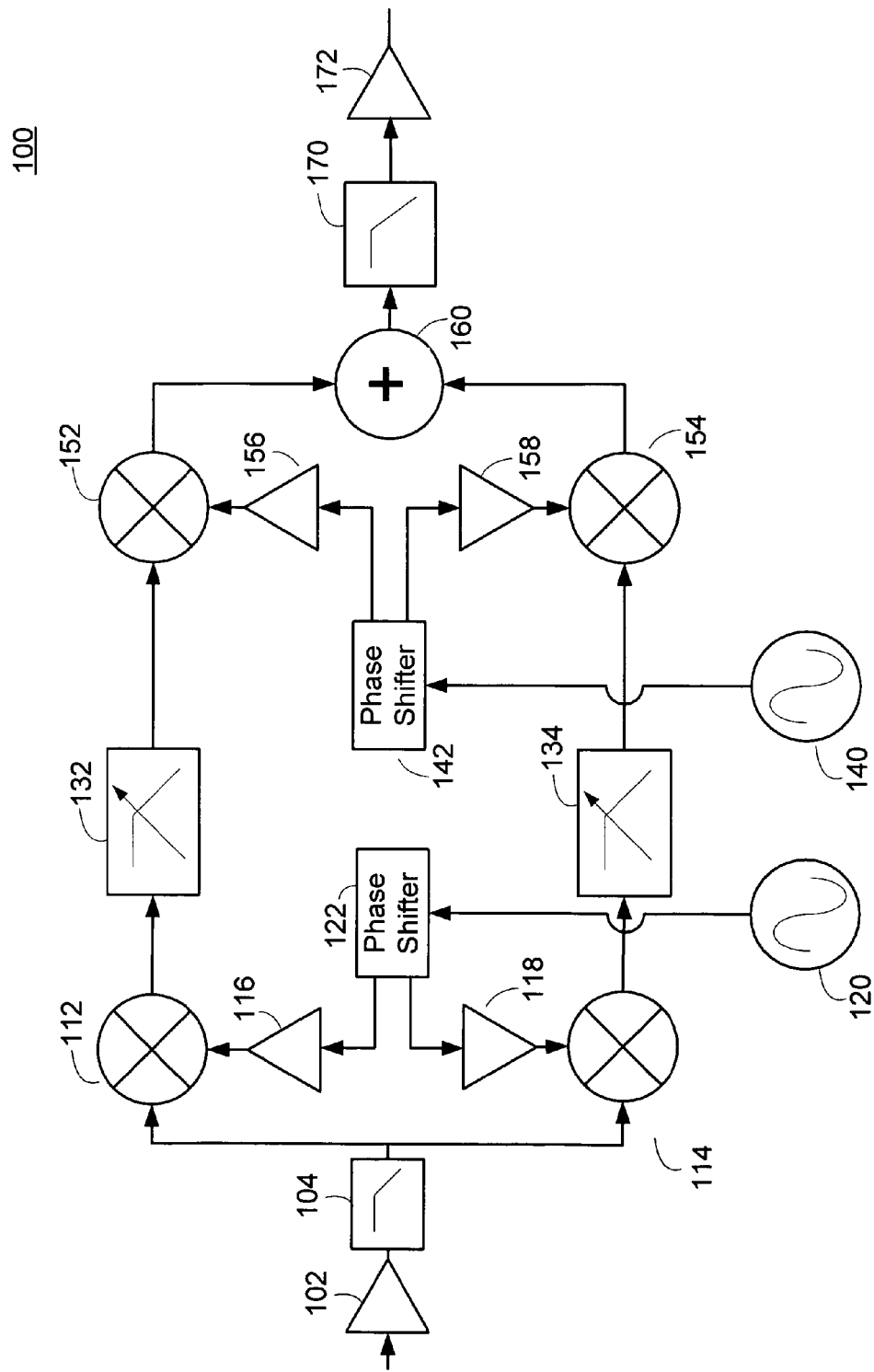
FIG. 2 is simplified functional block diagram of an embodiment of a receiver.

FIG. 2 is a simplified functional block diagram of an embodiment of a receiver 100 that can be implemented on one or more substrates of one or more integrated circuits (ICs). In some embodiments, it may be advantageous to integrate the entire receiver on a single IC. In other embodiments, it may be advantageous to integrate a portion of the receiver 100 in a first IC or on a first substrate and integrate the remainder of the receiver 100 on a second IC or second substrate. The first and second substrates can be implemented in a single package or may be implemented in distinct packages. For example, a signal path within the receiver 100 can be implemented on a first substrate and one or more local oscillators can be implemented on a second substrate and couple to the first substrate through one or more interconnects.

Although the signal interconnections shown in FIG. 2 appear as single ended signal interconnects, it is generally understood that some or all of the interconnections can be implemented as differential connections. It may be advantageous to implement differential interconnections, for example, for the purposes of noise reduction.

Portions of the receiver 100 can be implemented digitally, and can be configured to operate on digital representations of the signal. The digital processing of the signals within the receiver 100, and embodiments of receivers 100 having digital portions, are not explicitly illustrated in the receiver 100 to allow the description to focus on the functionality of the various blocks and modules.

The receiver 100 can be configured to provide significant harmonic rejection. When the receiver 100 is configured to process signals over a wide input signal band, such as in a television receiver application, the input frequency band may span multiple octaves. As such, the input frequency band may have potentially numerous signals at harmonics of the desired input signal. One or more of the signals at the harmonics of the desired input signal may have substantial signal strength and may even be stronger than the desired input signal.

The signals at the harmonics of the desired input signal can appear as interferers. Certain harmonic frequencies can be particularly troublesome interferers because signals at these harmonic frequencies can frequency convert to the same frequencies as the desired input signal. The receiver architectures and harmonic reject mixers disclosed herein can be used to substantially reduce the effects of input signals at harmonics of the desired input signal.

The receiver 100 can include an RF amplifier 102 that is configured to receive a signal at the input to the receiver 100 and amplify it. The RF amplifier 102 can be configured to receive a signal, for example, from an interconnect to an antenna or wired connection, such as a single ended wireline, a differential wireline, a twisted pair, a coaxial cable, a transmission line, a waveguide, an optical receiver configured to receive an optical signal over an optical fiber, and the like, or some other signal medium.

The RF amplifier 102 can be configured in any of several different embodiments or combination of embodiments, depending on the application. In one embodiment, the RF amplifier 102 can be a Low Noise Amplifier (LNA). In another embodiment, the RF amplifier 102 can be a variable gain amplifier, and the gain of the RF amplifier can be selected by one or more control lines (not shown) to the receiver 100. In the embodiment where the RF amplifier 102 is a variable gain amplifier, the gain of the RF amplifier 102 can be part of a gain control loop, such as an automatic gain control (AGC) loop (not shown). The RF amplifier 102 can be configured as a single amplifier stage or can include multiple amplifier stages. Where multiple amplifier stages are used, the amplifier stages can include serial, parallel, or a combination of serial and parallel amplifier configurations.

The output of the RF amplifier 102 can be coupled to a filter 104 that can be configured as a programmable harmonic rejection filter. The filter 104 can be configured, for example, as a programmable bandwidth lowpass filter, having a cutoff frequency that can be programmed to reduce undesired harmonic frequency components. As described below, the use of a harmonic reject frequency conversion stage can substantially reduce the constraints on the filter 104.

The output of the filter 104 can be coupled to inputs of first and second frequency conversion modules, here shown as a first mixer 112 and a second mixer 114. The first and second mixers 112 and 114 are shown as mixers, but can be any type of frequency conversion device exhibiting harmonic rejection. For example, the first and second mixers 112 and 114 can be double balanced mixers, double-quadrature mixers, interferometers, or some other type of frequency conversion device configured to reject the harmonics of an input signal.

The first and second mixers 112 and 114 can be configured to generate in-phase (I) and quadrature (Q) frequency converted signal components. The first mixer 112 is described as part of the in-phase signal path and the second mixer 114 is described as part of the quadrature signal path for purposes of discussion.

An RF LO 120 can be configured to generate a local oscillator signal to frequency convert the received RF signal to a baseband signal or a low Intermediate Frequency (IF) signal. As used herein, the term baseband signal refers to baseband signals as well as to signals that are substantially baseband signals. A signal is substantially a baseband signal if the frequency conversion process to downconvert a signal is imperfect, for example, due to LO offset errors or differences at the transmitter or receiver and errors or differences in the RF signal relative to a specified frequency of operation. For example, an RF signal may be different from a specified operating channel due to LO frequency shifts at the transmitter or Doppler shifts. Typically, the error or difference is a fraction of the baseband signal bandwidth.

A low IF signal can refer to an IF frequency that is less than twice the baseband signal bandwidth. However, in other embodiments, low IF can refer to less than 1.5, 2.5, 3, 4, 5, 10, or some other multiple of the baseband signal bandwidth. Typically, a low IF signal refers to a signal that is at a frequency sufficiently low to allow processing of the signal without additional frequency conversions.

The receiver 100 can be configured to operate using direct conversion to baseband in some operating modes while converting to a low IF in other operating modes. For example, the receiver 100 can operate in low-IF mode for analog TV applications, and substantially zero-IF for digital applications. Using distinct frequency conversion modes for separate operating modes may be advantageous because the receiver 100 architecture can be optimized for signal characteristics.

Analog television standards such as NTSC or PAL require less channel selection and image rejection in its low-pass filtering, but are much more sensitive to DC offset which typically are present in a zero-IF implementation. This makes an analog television receiver 100 more suited for a low-IF implementation, which may suffer from poorer channel selectivity, but which also substantially eliminates the DC offset problems associated with zero-IF.

Digital TV (e.g. DVB-T) requires greater channel selection, but is less sensitive to DC offset that may be introduced by a zero-IF architecture. This makes digital TV well-suited for a zero-IF approach, which offers better channel selectivity and no image rejection limitations, but may introduce some DC offset to the signal.

The frequency of the RF LO 120 can be programmable, and the frequency can be programmed based in part on the frequency of the desired signal. In a direct conversion frequency conversion, the output of the RF LO 120 can be substantially equal to the center frequency of a double side band input signal. In other embodiments, the RF LO 120 can be tuned to a frequency that is a multiple of the desired input frequency, and the frequency divided to the desired LO frequency.

The output of the RF LO 120 can be coupled to a first phase shifter 122 that can be configured to generate at least two distinct versions of a LO signal that are substantially in quadrature. Because inaccuracies in the quadrature LO signals can contribute to undesired signal components in the recovered signal, it is desirable to generate accurate quadrature LO signals. In one embodiment, the first phase shifter 122 can include a phase shifted signal path and a direct signal path, where the phase shifted signal path results in a signal that is substantially 90 degrees shifted relative to the signal from the direct signal path. In another embodiment, the first phase shifter 122 can include a polyphase filter that is configured to generate the two LO signals in quadrature.

The in-phase LO signal can be coupled to an in-phase LO buffer amplifier 116 that amplifies the in-phase LO signal and couples it to a LO input port of the first mixer 112. Similarly, the quadrature LO signal can be coupled to a quadrature LO buffer amplifier 118 that amplifies the quadrature LO signal and couples it to a LO port of the second mixer 114.

The output of the first mixer 112 can be an in-phase baseband signal that is coupled to an in-phase filter 132. The in-phase filter 132 can be programmable filter whose bandwidth can be selected based on one or more control signals (not shown) provided to the receiver 100. The bandwidth of the in-phase filter 132 can be selected, for example, based on a communication standard or mode that the receiver 100 is configured to support. Therefore, where the receiver 100 is configured to support multiple standards having different channel bandwidths, the bandwidth of the in-phase filter 132 can be selected based in part on the presently supported mode.

When the signal is a baseband signal or a low IF signal, the in-phase filter 132 can be configured as a low pass filter. Alternatively, the in-phase filter 132 can be configured as a bandpass filter if the low IF signal has sufficient bandwidth to make the use of a low pass filter undesirable.

The output of the in-phase filter 132 can be coupled to a third mixer 152 configured to frequency convert the in-phase signal to a desired output IF. In one embodiment, the output of the in-phase filter 132 is a baseband signal and the third mixer is configured to upconvert the in-phase baseband signal to an output IF.

The third mixer 152 can be driven by a programmable LO that is generated in much the same manner that is used to generate the LO for the first and second mixers 112 and 114. The IF LO 140 can be programmable to allow the output IF to be selected based in part on the mode supported by the receiver 100. For example, the receiver 100 can be configured to frequency convert the input signals to a predetermined IF that can depend on the manner in which the user configures the system having the receiver 100. For example, a set top box for television signals can be configured to generate an output signal at a predetermined IF, such as 70 MHz, or at a frequency corresponding to a television channel.

The output of the IF LO 140 can be coupled to a second phase shifter 142 that is configured to generate substantially quadrature LO signals. An in-phase LO output from the second phase shifter 142 can be coupled to an in-phase buffer amplifier 156 that amplifies the in-phase LO signal and couples it to the LO input of the third mixer 152. The output of the third mixer 152 is an in-phase IF signal that is coupled to a first input of a signal combiner 160.

The quadrature signal path is configured to be substantially identical to the in-phase signal path. The two signal paths are typically substantially matched to reduce undesirable signal components that can be generated due to I and Q mismatches.

The output of the second mixer 114 can be a baseband quadrature signal that is coupled to an input of a quadrature filter 134. The quadrature filter 134 can be configured as a programmable low pass filter having programmable bandwidth. Typically, the configuration and bandwidths of the in-phase and quadrature filters 132 and 134 are the same such that the in-phase and quadrature signal paths remain substantially matched.

The output of the quadrature filter 134 can be coupled to an input of a fourth mixer 154 that is configured to upconvert the quadrature signal to the output IF. The fourth mixer 154 is driven by an LO signal that is generated by the IF LO 140. The output of the IF LO 140 is coupled to a second phase shifter 142 that generates a quadrature LO signal. The quadrature LO signal is coupled to a quadrature buffer amplifier 158 which amplifies the quadrature LO signal and couples it to an LO input of the fourth mixer 154. The output of the fourth mixer 154 can be a quadrature IF signal. The quadrature IF signal can be coupled to a second input of the signal combiner 160.

The signal combiner 160 can be configured to combine the in-phase and quadrature IF signals. The signal combiner 160 can be, for example, a signal summer that sums the in-phase IF signal with the quadrature IF signal. In one embodiment, the signal combiner 160 sums the two signals while maintaining their phases. In another embodiment, the signal combiner 160 can invert one of the phases and sum the two signals. In yet another embodiment, the signal combiner 160 can generate the sum of the two signals and can invert the output signal.

The output of the signal combiner 160 represents the output IF signal. The output IF signal can be coupled to an output filter 170 that can be, for example, a low pass filter or bandpass filter that is configured to remove undesired signal products from the IF output signal. The output filter 170 can be configured as a fixed bandwidth filter or can be configured as a programmable bandwidth filter, where the bandwidth is determine, in part, based on a mode of the receiver 100.

The output of the output filter 170 can be coupled to an IF amplifier 172 that can be configured to amplify the output. The IF amplifier 172 can be a variable gain amplifier. The gain of the IF amplifier 172 can be controlled using one or more control inputs (not shown) on the receiver 100. The output of the IF amplifier 172 can be the output of the receiver 100.

It may be advantageous to implement the entire receiver 100 on a single integrated circuit, such that the processes and conditions used to manufacture the in-phase and quadrature signal components are closely matched, resulting in more closely matched I and Q signal paths. Additionally, it may be advantageous to implement the components on a single IC to minimize path length distances or variations that contribute to mismatches. A single IC implementation can also result in a smaller receiver 100 package.

Figure 3:
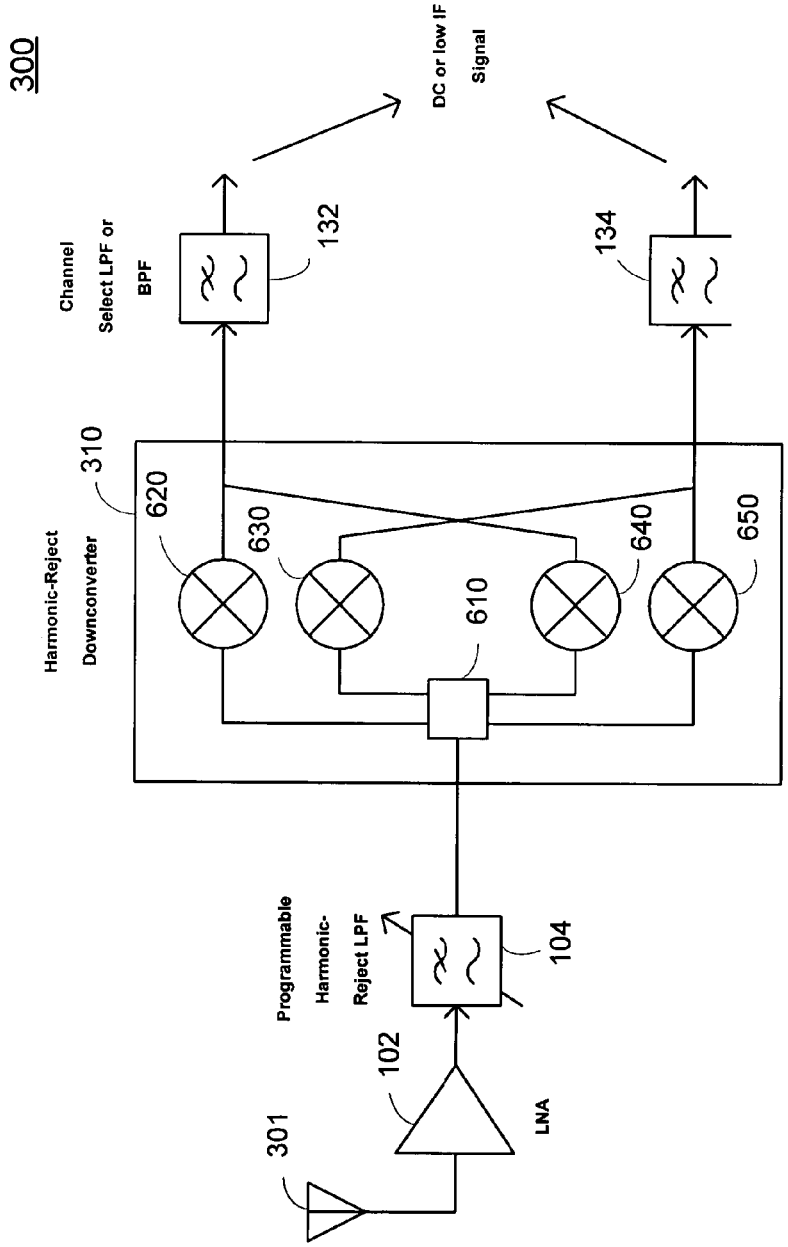
FIG. 3 is a simplified functional block diagram of an embodiment of a receiver front end.

FIG. 3 is a simplified functional block diagram of a harmonic reject receiver front end 300 configured to downconvert a desired signal to baseband or IF while substantially attenuating signals generated by the harmonics of the desired input signal. The receiver front end 300 can be used, for example, in the receiver embodiments shown in FIGS. 1 and 2.

The receiver front end 300 is configured to receive input signals via an antenna 301. Although the receiver front end 300 is described as receiving signals via an antenna 310. the receiver front end 300 can be configured to omit the antenna 310 and can receive signals via a wired link (not shown).

The output of the antenna 301 is coupled to an RF amplifier 102, such as a LNA. The RF amplifier 102 can be configured to amplify substantially the entire input frequency band. A receiver front end 300 configured to support processing of television signals may need to support an input frequency band spanning multiple octaves.

The output of the RF amplifier 102 is coupled to a programmable harmonic reject filter 140, which can be configured as a programmable bandwidth low pass filter. The cutoff frequency of the programmable harmonic reject filter 140 can be controlled to a frequency that is based at least in part on the frequency of the desired input signal. In some embodiments, the cutoff frequency is programmable over a wide frequency range that spans multiple octaves.

Harmonic rejection is typically achieved by applying large amounts of filtering prior to mixing. In RF applications where the signal band is narrow compared with the carrier frequency of the desired input signal, harmonic rejection is a natural byproduct of front-end filtering from band-select filters or the antenna 301. In a broadband application, harmonic interferers constitute a significant problem, and harmonic rejection low-pass filtering needs to be programmable to allow the receiver to receive channels across the entire band while achieving the desired harmonic suppression. The implementation of the programmable harmonic reject filter 140 incurs a power and area penalty. Additionally, rejecting input harmonics with solely a programmable harmonic reject filter 140 may have limited effectiveness, and can also results in signal path losses and associated noise degradation in performance.

The embodiment of the receiver front end 300 illustrated in FIG. 3 uses a harmonic rejection downconverter 310 to further suppress the response to higher harmonics of the desired fundamental. The harmonic reject downconverter 310 can relax the filter requirements imposed on the programmable harmonic reject filter 140, or can improve the harmonic reject performance by providing harmonic suppression in addition to that provided by the programmable harmonic reject filter 140. The harmonic rejection downconverter 310 is illustrated as a double quadrature mixer implementing harmonic reject mixers. The particular embodiment of the harmonic rejection downconverter 310 is described in further detail in association with FIG. 6.

In the embodiment of the receiver front end 300 shown in FIG. 3, the output of the programmable harmonic reject filter 140 is coupled to an input of the harmonic rejection downconverter 310. The harmonic reject downconverter 310 is configured to generate quadrature output signals. The output signals can be at baseband, a low IF, or an IF, depending on the frequencies of the desired input signal and the LO (not shown).

An in-phase filter 132 can be configured to filter the in-phase signal component and a quadrature filter 134 can be configured to filter the quadrature signal component. The outputs of the filters 132 and 134 can be coupled to additional stages for further processing, such as those shown in FIG. 2.

Figure 4:
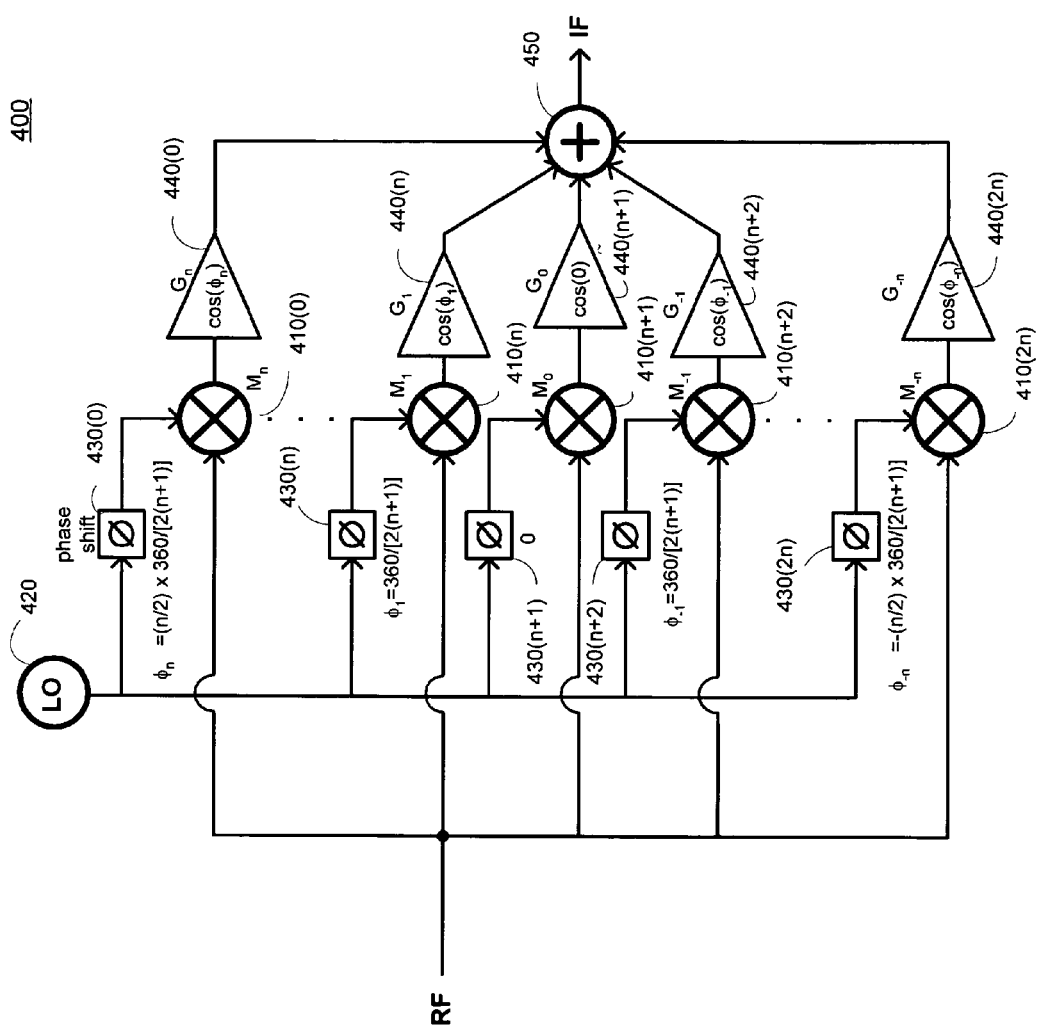
FIG. 4 is a simplified functional block diagram of an embodiment of a harmonic reject mixer.

FIG. 4 is a simplified functional block diagram of an embodiment of a harmonic reject mixer 400. The harmonic reject mixer 400 can be used, for example, in the receiver of FIG. 2 or the receiver front end of FIG. 3 to provide rejection of undesired harmonics of the input signal.

The harmonic reject mixer 400 includes (2n+1) switching mixers 410(0)-410(2n). The RF input signal is coupled to an input of each of the switching mixers 410(0)-410(2n). Each of the switching mixers 410(0)-410(2n) is driven by a phase offset version of a Local Oscillator (LO) 420 output signal. The number of switching mixers 410(0)-410(2n) should be greater than one to achieve harmonic rejection. Each of the switching mixers 410(0)-410(2n) can be, for example, a CMOS switching mixer.

The output from the LO 420 is coupled to (2n+1) phase shifters 430(0)-430(2n). The phase shifters can be distinct phase shifters or distinct phase outputs of one or more phase shifters having multiple outputs. Each of the phase shifters 430(0)-430(2n) is configured to shift the phase of the LO 420 signal by a predetermined discrete phase. The LO 420 signal, phase shifted in discrete steps ($\phi_n$-$\phi_{-n}$), is used to drive the LO inputs of the switching mixers 410(0)-410(2n).

In one embodiment, the phase shifters 430(0)-430(2n) provide (2n+1) versions of the LO signal equally spaced about a half cycle. For example, the phase shifters can be configured to provide LO phases equally spaced in the interval of −90-+90 degrees. That is, each of the phase shifters 430(0)-430(2n) can be configured to provide a discrete phase shift (in degrees) determined by the formula $$\phi_n = (n/2) \times 360/[2(n+1)].$$

Each of the outputs from the switching mixers 410(0)-410(2n) is coupled to a corresponding amplifier 440(0)-440(2n). The switching mixer output signals are scaled by their respective gains $G_n$-$G_{-n}$. In one embodiment, each of gains is configured to equalize the signal gain through each of the switching mixer amplifier paths. In another embodiment, all of the gains are substantially the same. In still another embodiment, each of the individual gains can be set to a distinct value determined based on the phase shift provided by the corresponding phase shifter. For example, the gain of each amplifier can be based on $\cos(\phi_j)$.

The outputs of the amplifiers 440(0)-440(2n) are coupled to a combiner 450, here shown as a signal summer. The combiner 450 combines the amplified switching mixer outputs into a single frequency converted output signal.

The harmonic rejection arises from the fact that the mixer 400 approximates a linear mixer (ideal multiplication by a sinusoid) using shifted and scaled versions of the mixed RF signal. The LO 420 control the transitions of the various switching mixers 440(0)-440(2n) based on the phase shifts. In one embodiment, there are (2n+1) switching mixer transitions in each LO period. For the case of n=0, the harmonic reject mixer is substantially identical to the response of a single switching mixer.

The harmonic mixer 400 includes a plurality of switching mixers, each driven by a distinct phase of an LO signal. This accomplishes the dual purpose of permitting low-noise switching mixer designs driven by relatively simple LO circuits, while achieving high harmonic rejection across a wide range of harmonics.

Figure 5:
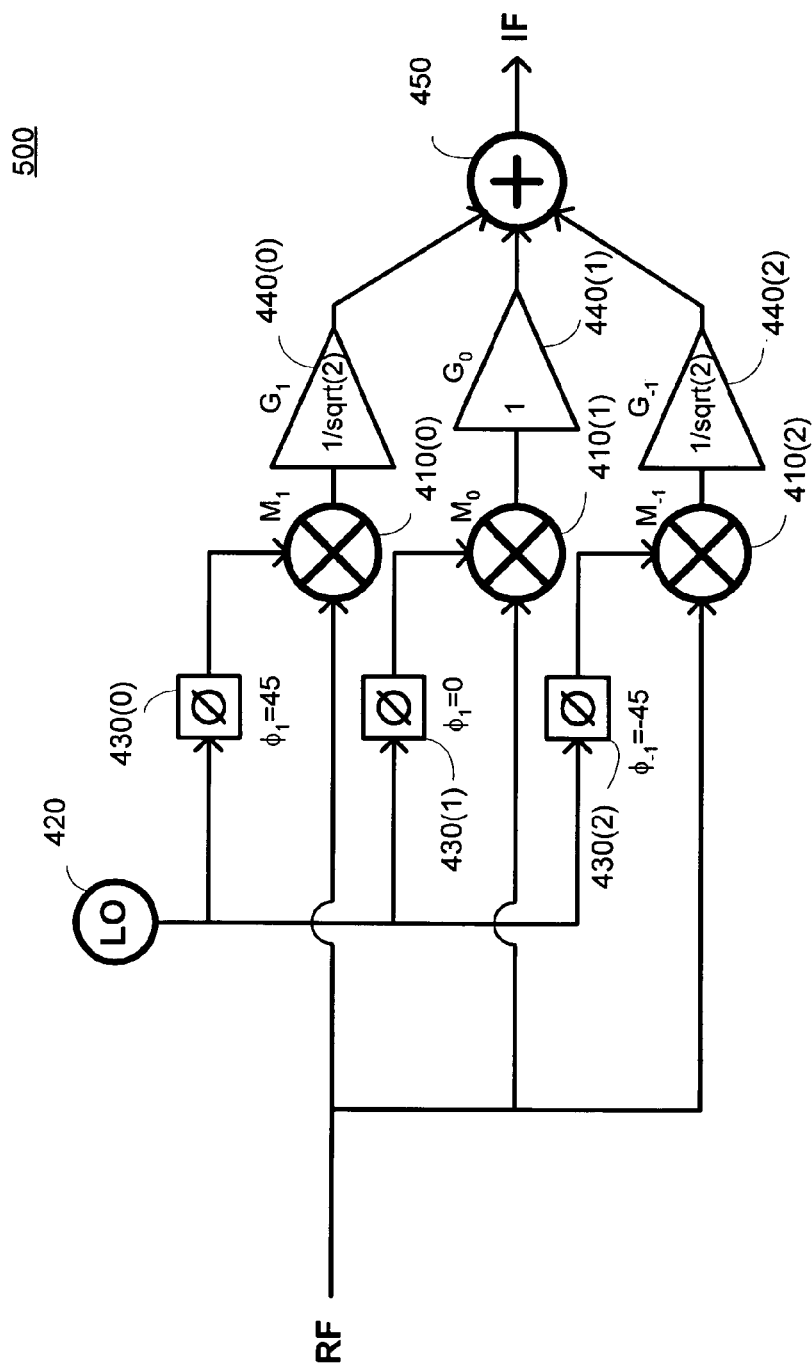
FIG. 5 is a simplified functional block diagram of an embodiment of a harmonic reject mixer.

FIG. 5 is a simplified functional block diagram of an embodiment of a harmonic reject mixer 500 using three distinct phases. Thus, the embodiment of FIG. 5 corresponds to the generalized harmonic reject mixer of FIG. 4 with n=1.

Thus, the RF input signal is coupled to three switching mixers 410(0)-410(2). An output of a LO 420 is coupled to three distinct phase shifters 430(0)-430(2). Using the formula provided above, the three phase shifters 430(0)-430(2) provide phase shifts of +45, 0, and −45 degrees. The switching mixer 410(0)-410(2) outputs are coupled to corresponding amplifiers 440(0)-440(2). The corresponding amplifier gains are scaled by $(1/\sqrt{2})$, 1, and $(1/\sqrt{2})$, respectively. The outputs of the three amplifiers 440(0)-440(2) are coupled to an input of a signal summer 450 where they are summed to an output IF or baseband signal.

Figure 6:
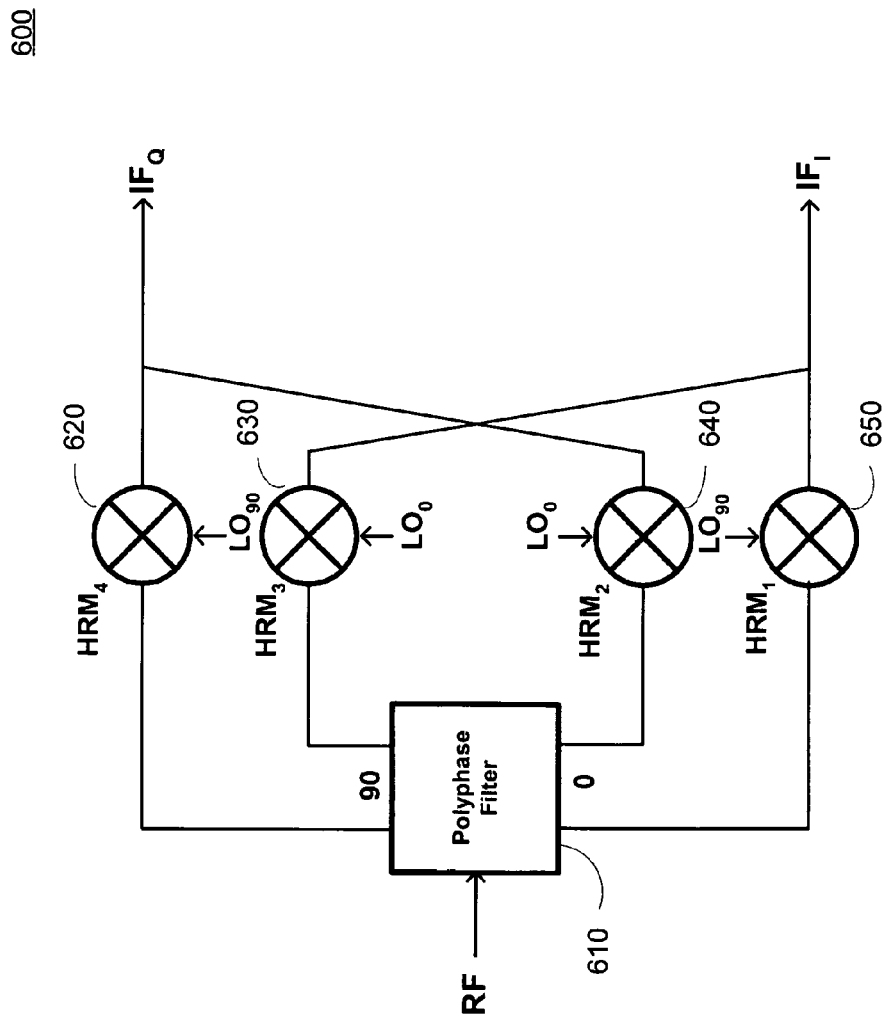
FIG. 6 is a simplified functional block diagram of a down-converter having harmonic reject mixers.

FIG. 6 is a simplified functional block diagram of a down-converter 600 having harmonic reject mixers 620, 630, 640, and 650. Each of the harmonic mixers 620, 630, 640, and 650, can be configured as shown in FIG. 4 or 5.

The downconverter 600 of FIG. 6 is implemented as a double balanced quadrature mixer. The double balanced quadrature mixer configuration shown in FIG. 6 provides additional harmonic rejection of the 5th and 9th harmonics. The additional harmonic rejection provided by the double balanced quadrature configuration permits the use of more simple harmonic reject mixers 620, 630, 640, and 650 in the core. This may be advantageous from a standpoint of fabrication, area, gate count, complexity, or cost.

In the downconverter 600 configured as a double balanced quadrature mixer, an input RF signal is coupled to a polyphase filter 610. The polyphase filter 610 generates multiple phase outputs from the input signal. In the embodiment shown in FIG. 6, the polyphase filter 610 is configured to generate in-phase and quadrature signal outputs.

The quadrature signal outputs are coupled to first and second harmonic mixers 620 and 630. The in-phase signal outputs are coupled to third and fourth harmonic mixers 640 and 650.

The second and third harmonic mixers, 630 and 640, are driven with an in-phase LO signal. The first and fourth harmonic mixers, 620 and 650, are driven with a quadrature LO signal. The outputs of the first and third harmonic mixers, 620 and 640, are combined to generate the quadrature downconverted signal, while the outputs of the second and third harmonic mixers 630 and 650 are combined to generate the in-phase downconverted signal.

Harmonic mixers, receivers using harmonic mixers, and methods of processing input signals to reduce the contribution of input harmonics have been described. A harmonic mixer can include a plurality of switching mixers, each driven with a distinct phase of a common LO. The outputs of the switching mixers can be combined or otherwise summed to a single output signal. The output signal exhibits reduced contribution from input harmonics.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A quadrature mixer comprising:
   one or more harmonic reject mixers, each of the one or more harmonic reject mixers comprising:
   a common RF input,
   a control input coupled to a control signal,
   an LO generator operable to generate a plurality of phased LO signals, wherein each of the plurality of phased LO signals is generated according to a respective transition of a plurality of transitions of the control signal, and
   a plurality of switching mixer circuits, wherein each of the plurality of switching mixer circuits comprises a first input coupled to the common RF input and a second input coupled to one of the plurality of phased LO signals;
   a control generator operable to generate the control signal comprising the plurality of transitions during a period of each phased LO signal;
   a first combiner having inputs coupled to a first subset of outputs from the one or more harmonic reject mixers, and an output configured to provide a quadrature output; and
   a second combiner having inputs coupled to a second subset of outputs from the one or more harmonic reject mixers, and an output configured to provide an in-phase output; wherein the first subset of outputs is shifted with respect to the second set of outputs.

2. The quadrature mixer of claim 1, wherein the control signal controls the transitions of each switching mixer circuit and each switching mixer circuit transitions once in each LO period.

3. The quadrature mixer of claim 1, wherein the in-phase output is an in-phase intermediate frequency (IF) output and the quadrature output is a quadrature intermediate frequency (IF) output.

4. The quadrature mixer of claim 2, wherein the first combiner applies one or more weights to the first subset of outputs and the second combiner applies one or more weights to the second subset of outputs.

5. The quadrature mixer of claim 4, wherein the weight is based on a sinusoidal function of the phase associated with the corresponding switching mixer.

6. A method of quadrature mixing, the method comprising:
   generating a single control signal comprising a plurality of transitions;
   generating a plurality of distinct phased LO signals, wherein the plurality of transitions of the single control signal occur during a period of each distinct phased LO signal, and wherein each of the plurality of distinct phased LO signals is generated according to a respective transition of the plurality of transitions of the single control signal;
   mixing an input signal with each of the plurality of distinct phased LO signals to generate a plurality of mixer outputs;
   combining a first subset of mixer outputs to generate a quadrature mixer output; and combining a second subset of mixer outputs to generate an in-phase mixer output;
   wherein the first subset of mixer outputs is shifted with respect to the second set of outputs.

7. The method of quadrature mixing of claim 6, wherein the in-phase mixer output is an in-phase intermediate frequency (IF) output and the quadrature mixer output is a quadrature intermediate frequency (IF) output.

8. A quadrature mixer comprising:
   an oscillator operable to generate a control signal comprising a plurality of transitions;
   an LO generator operable to generate a plurality of distinct phased local oscillation (LO) signals, wherein the plurality of transitions of the control signal occur during a period of each distinct phased LO signal, and wherein each of the plurality of distinct phased LO signals is generated based on a respective transition of the plurality of transitions of the control signal;
   a plurality of mixers, each mixer in the plurality of mixers being operable to receive a common radio frequency (RF) signal and being driven by one of the plurality of distinct phased LO signals;
   a plurality of gain stages operable to provide a plurality of weighted mixer outputs, each gain stage in the a plurality of gain stages being operable to apply a particular weight to an output of a particular mixer in the plurality of mixers;
   a first combiner operable to combine a first subset of weighted mixer outputs and provide a quadrature output; and
   a second combiner operable to combine a second subset of weighted mixer outputs and provide an in-phase output.

9. The quadrature mixer of claim 8, wherein the particular weight applied to the output of the particular mixer is based on a sinusoidal function of the phase corresponding to the distinct transition that drives the particular mixer.

10. The quadrature mixer of claim 8, wherein each of the plurality of mixers comprises a switching mixer.

11. The quadrature mixer of claim 8, wherein each of the plurality of mixers comprises a CMOS switching mixer.

12. The quadrature mixer of claim 8, wherein the common RF signal comprises a specified channel and a difference between a frequency of the specified channel and a frequency of the LO signal is less than a bandwidth of the specified channel.

13. The quadrature mixer of claim 12, wherein the in-phase output is baseband and the quadrature output is baseband.

14. The quadrature mixer of claim 12, wherein the in-phase output is substantially baseband and the quadrature output is substantially baseband.

15. The quadrature mixer of claim 14, wherein the difference between the frequency of the specified channel and the frequency of the LO signal is non-zero.

16. The quadrature mixer of claim 8, wherein the common RF signal comprises a specified channel and a difference between a frequency of the specified channel and a frequency of the LO signal is greater than a bandwidth of the specified channel.

17. The quadrature mixer of claim 16, wherein the in-phase output is an in-phase intermediate frequency (IF) output and the quadrature output is a quadrature IF output.

18. The quadrature mixer of claim 8, wherein signals in the second subset of weighted mixer outputs are shifted relative to signals in the first subset of weighted mixer outputs.

19. The quadrature mixer of claim 8, wherein the first combiner is a first summing circuit and the second combiner is a second summing circuit.

20. The quadrature mixer of claim 8, wherein there is an odd number of mixers in the plurality of mixers.

21. The quadrature mixer of claim 8, wherein a number of distinct transitions in the plurality of transitions is equal to a number of mixers in the plurality of mixers.

22. The quadrature mixer of claim 8, wherein a number of mixers in the plurality of mixers is equal to a number of weighted mixer outputs in the first subset of weighted mixer outputs.

* * * * *